(12) United States Patent
Zhou et al.

(10) Patent No.: US 10,374,506 B1
(45) Date of Patent: Aug. 6, 2019

(54) ADAPTIVE CONTROL METHOD FOR ZERO VOLTAGE SWITCHING

(71) Applicant: University of Electronic Science and Technology of China, Chengdu (CN)

(72) Inventors: Ze-kun Zhou, Chengdu (CN); Jun-Lin Qian, Chengdu (CN); Xiao-Lin Liu, Chengdu (CN); Yue Shi, Chengdu (CN); Zhuo Wang, Chengdu (CN); Bo Zhang, Chengdu (CN)

(73) Assignee: University of Electronics Science and Technology of China, Chengdu (CN)

( * ) Notice: Subject to any disclaimer, the term of this patent is extended or adjusted under 35 U.S.C. 154(b) by 0 days.

(21) Appl. No.: 16/174,307

(22) Filed: Oct. 30, 2018

(30) Foreign Application Priority Data

Sep. 18, 2018 (CN) .......................... 2018 1 1087649

(51) Int. Cl.
| | | |
|---|---|---|
| H02M 1/08 | (2006.01) | |
| H02M 3/156 | (2006.01) | |
| H03K 21/08 | (2006.01) | |
| H02M 1/00 | (2006.01) | |

(52) U.S. Cl.
CPC ........... *H02M 1/083* (2013.01); *H02M 3/156* (2013.01); *H03K 21/08* (2013.01); *H02M 2001/0058* (2013.01)

(58) Field of Classification Search
CPC ...... H02M 1/083; H02M 3/156; H02M 3/157; H02M 2001/0058
USPC .................................. 327/108, 109, 110, 111
See application file for complete search history.

(56) References Cited

U.S. PATENT DOCUMENTS

| | | | | |
|---|---|---|---|---|
| 2008/0278984 | A1* | 11/2008 | Stanley | ................... H02M 7/48 363/95 |
| 2015/0318850 | A1* | 11/2015 | Hiyama | ............... H03K 17/163 318/400.26 |

\* cited by examiner

*Primary Examiner* — William Hernandez
(74) *Attorney, Agent, or Firm* — Gokalp Bayramoglu

(57) ABSTRACT

An adaptive control method for zero voltage switching belongs to the field of integrated circuit. In the present invention, the difference between the turn-on time of the power tube and the time of the lowest drain voltage of the power tube in the switching cycle is quantified by the reversible counter, and the quantized result is transmitted to the next switching cycle to adjust the turn-on time of the power tube through the final count result of the reversible counter, so that the power tube after being adjusted can be turned on when the drain voltage of the power tube is the lowest, thus reducing the switching loss. The present invention can adaptively turn on the power tube when the drain voltage of the power tube reaches minimum, thus, realizing the zero-voltage switching, reducing the switching loss of the switching power supply, widening the application range.

2 Claims, 2 Drawing Sheets

ADAPTIVE CONTROL METHOD FOR ZERO VOLTAGE SWITCHING

CROSS REFERENCE TO RELATED APPLICATIONS

This application is based upon and claims priority to Chinese Patent Application No. 201811087649.6, filed on Sep. 18, 2018, the entire contents of which are incorporated herein by reference.

TECHNICAL FIELD

The present invention belongs to the field of integrated circuit technology, and relates to an adaptive control method for turning on a power tube to realize zero voltage switching when a drain voltage of the power tube reaches a minimum.

BACKGROUND

With the rapid development of electronics technology, various electronic products have become a necessity in people's lives. The power supply is one of the components of the electronic equipment. The DC-DC converter is an important part of the switching power supply. The power consumption of the converter is one of the important indicators to measure the performance of the power supply. When the power tube of the switching power supply is turned on at different times of the switching cycle, the switching loss of the switching power supply is different. The switching loss is minimized when the power tube is turned on at the lowest drain voltage.

In Buck topology, when the power tube is turned off and the current of the inductor L drops to zero, LC resonance occurs in the inductor L and the parasitic capacitance $C_p$ at the drain terminal of the switch transistor. Similarly, when the power tube is turned on at different times of the resonance, the switching loss of the converter is different. Wherein, when the resonance at the drain terminal of the power tube reaches the valley point, the drain voltage of the power tube is the lowest, and the switching power loss of the power tube is minimized. In the conventional control method, the valley signal Valley and the enable signal C of the gate driving circuit are the same signal. There is a certain delay from the generation of the enable signal C of the gate driving circuit to the actual conduction of the power tube, so that the power tube is turned on after the valley point, resulting in high system power consumption. Additionally, the external LC resonant frequency will vary with application conditions, and the delay of gate driving circuit will also be affected by changes of other factors, for example, the type of external power tube and temperature, etc. Therefore, the conventional method will make the system consume different amount of power in different applications, which cannot be widely used.

SUMMARY

To solve the problem of larger switching loss caused by the power tube not being turned on at the lowest drain voltage in conventional switching power supplies and the problem that the conventional control method cannot be widely used, the present invention provides a control method suitable for switching power supply, which can adaptively turn on the power tube at the lowest drain voltage of the power tube to realize zero voltage switching, and reduce the power consumption of the switching power supply.

The technical solution of the present invention is as follows:

An adaptive control method for zero voltage switching, wherein the control method turns on a power tube at the lowest drain voltage by adjusting turn-on time of the power tube in a switching power supply in each switching cycle, and the power tube is controlled to be turned on or off by a gate driving circuit.

In an Nth switching cycle is a positive integer greater than 1), the control method for adjusting the turn-on time of the power tube in the switching power supply, includes the following steps.

Step1. Turning off the power tube, and then controlling a reversible counter and a backward counter to start counting by using the same clock signal. The reversible counter starts counting from zero and the backward counter starts counting down from a value that is a final result generated by the reversible counter in a N−1th switching cycle.

Step2. When the backward counter counts to zero, making the backward counter stop counting and the reversible counter pause counting, and enabling the gate driving circuit.

Step3. Detecting whether a drain voltage of the power tube reaches a minimum value and whether an output voltage of the gate driving circuit is inverted. When, it is detected that the drain voltage of the power tube has reached a minimum value, controlling the reversible counter to count down until the output voltage of the gate driving circuit is detected to be inverted. On detecting that the output voltage of the gate driving circuit is inverted, making the reversible counter increment by one and then stop counting.

Step4. Storing a final counting result of the reversible counter obtained in step 3 and using the final counting result as an initial value of the backward counter described in step 1 in an N+1th switching cycle, and then resetting the reversible counter.

During the first switching cycle, using the clock signal to control the reversible counter to increment from zero after the power tube is turned off, then detecting whether the drain voltage of the power tube reaches the minimum value. On detecting that the drain voltage of the power tube has reached the minimum value, enabling the gate driving circuit, making the reversible counter stop counting, and using a final counting result of the reversible counter in the first switching cycle as an initial value of the backward counter in the second switching cycle.

Specifically, once a resonance occurs at the drain terminal of the power tube, in step 1, after turning off the power tube, firstly detecting whether the resonance occurs at the drain terminal of the power tube. Once detected that the resonance occurs, using an oscillator to generate the clock signal to control the reversible counter and the backward counter to start counting.

The beneficial effects of the present invention are that the control method of the present invention can adaptively turn on the power tube when the drain voltage of the power tube reaches a minimum value, thereby realizing zero voltage switching, reducing the power consumption of the switching power supply, and widening the application range.

DETAILED DESCRIPTION OF THE EMBODIMENTS

The present invention will be further described below reference to the accompanying drawings and specific embodiments.

The present invention is suitable for the switch power supply. The present invention changes the turn-on time of the power tube in the latter switching cycle according to the difference between the turn-on time of the power tube and the time of the lowest drain voltage of the power tube collected in the previous switching cycle. A complete switching cycle is the time from the beginning of turning on the power tube to the next turning on of the switch transistor after truing off the power tube. After the switch transistor is turned off during each switching cycle, by using the reversible counter and the backward counter controlled by the same clock signal, the backward counter starts counting down from the final count result of the reversible counter obtained in the previous switching cycle. When the backward counter counts down to 0, the reversible counter can record the final count result of the reversible counter obtained in the previous switching cycle. At this time, the gate driving circuit is enabled, the backward counter stops counting, and the reversible counter pauses counting. There is still a delay time from that the gate driving circuit is enabled to that the switch transistor is turned on. In the present invention, the difference between the turn-on time of the power tube and the time of the lowest drain voltage of the power tube in the switching cycle is quantified by the reversible counter, and the quantized result is transmitted to the next switching cycle to adjust the turn-on time of the power tuber through the final count result of the reversible counter, so that the power tube, after being adjusted, can be turned on when the drain voltage of the power tube is the lowest, thus reducing the switching loss.

In some switching power supplies, LC resonance occurs in the inductor and the parasitic capacitance at the drain terminal of the power tube r. The following describes the working process and working principle of the present invention by taking the resonance occurring at the drain terminal of the power tube as an example.

Figure 1:
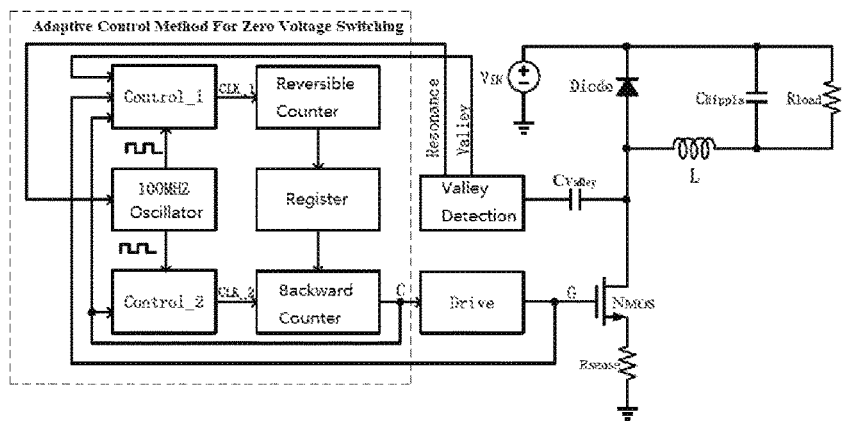
FIG. 1 is a topology diagram of a control circuit for implementing the adaptive control method for zero voltage switching provided by the present invention.

As shown in FIG. 1, it is a topology diagram of a control circuit for implementing the adaptive control method for zero voltage switching provided by the present invention. The control circuit includes a 100 MHz oscillator, a first control module Control_1, a 6bit reversible counter, a 6bit register, a second control module Control_2 and a 6bit backward counter. In this embodiment, the power tube of the switching power supply is an NMOS tube. The power tube is controlled by the gate driving circuit. When the output signal G of the gate driving circuit turns from low to high, the power tube is turned on and the gate driving circuit is enabled by an output signal C of the backward counter. In this embodiment, a valley detection circuit is used to detect whether resonance occurs at the drain terminal of the power tube and the valley point of the resonance. When the resonance generation signal Resonance generated by the valley detection circuit turns high, it indicates that the resonance occurs. When the valley signal Valley generated by the valley detection circuit turns high, it indicates that the lowest valley point is detected.

Figure 2:
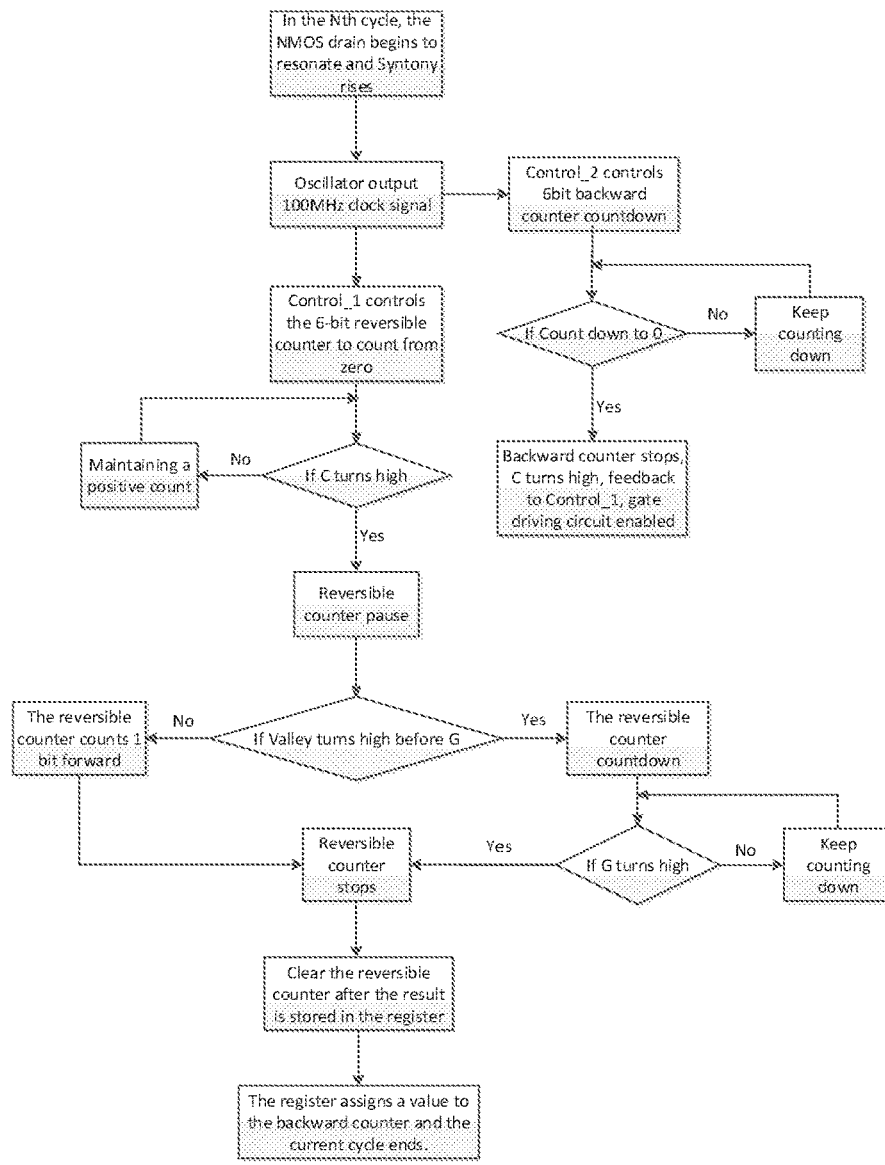
FIG. 2 is a flow chart of the adaptive control method for zero voltage switching provided by the embodiment of the present invention when resonance occurs at the drain terminal of the power tube.

As shown in FIG. 2, the working flow chart in this embodiment includes the following steps in the Nth switching cycle:

a). In the Nth switching cycle, turning off the power tube, so that the current of inductor begins to drop. When the current of inductor reaches to zero, the resonance occurs at the drain terminal of the power tube. Then using the valley detection circuit to detect the resonance, and turning high the resonance generation signal resonance to enable the 100 MHz oscillator. Transmitting a 100 MHz square wave signal generated by the 100 MHz oscillator to the first control module Control_1 and the second control module Control_2. The first control module Control_1 outputs the 100 MHz square wave signal as a clock signal of the reversible counter to control the reversible counter to count up from zero. At the same time, the second control module Control_2 also outputs the 100 MHz square wave signal as a clock signal of the backward counter to control the backward counter to count down from the final count result $T_{N-1}$ of the reversible counter obtained in the N−1th switching cycle.

b). When the backward counter counts down to 0, turning high the enable signal C of the backward counter which enables the gate driving circuit, and stopping the backward counter. The high level enable signal C has two effects: one is to enable the gate driving circuit to turn on the power tube, and the other is to give feedback to the first control module Control_1, once the first control module Control_1 receives the high level enable signal C, the first control module Control_1 makes the reversible counter pause and enter a waiting state.

c). In the waiting process of the reversible counter, detecting whether the resonance at the drain terminal of the power tube reaches the valley point by the valley detection circuit. When the valley point is reached, turning high the valley signal Valley. At the same time, detecting whether the output signal G of the gate driving circuit is turned high to turn on the power tube, feeding back the valley signal Valley and the output signal G of the gate driving circuit to the first control module Control_1.

When the first control module Control_1 detects that the valley signal Valley turning high is earlier than that of the output signal G, it means that in the Nth switching cycle, the turn-on time of the power tube is behind the valley point of the resonance. In the N+1th switching cycle, the power tube should be turned on in advance for a while, which is the interval time between the rising edge of the output signal G of the gate driving circuit and the rising edge of the valley signal Valley. The reversible counter enters the reverse count state from the waiting state. The reversible counter stops counting until the rising edge of the output signal G of the gate driving circuit is detected by the first control module Contron_1, so that the time interval between the rising edge of the output signal G of the gate driving circuit and the rising edge of the valley signal Valley is quantized and is marked as the final result $T_N$ of the reversible counter in the Nth switching cycle.

When the first control module Control_1 detects that the valley signal Valley turning high is earlier than that of the output signal G, it indicates that in the Nth switching cycle, the turn-on time of the power tube takes precedence over the valley point of the resonance. In the N+1th switching cycle, it needs some time to delay the turn-on of the power tube, which is the time interval between the rising edge of the output signal G of the gate driving circuit and the rising edge of the valley signal Valley. However, since the power tube is turned on, the potential of the drain terminal of the power tube is immediately pulled down, and the valley detecting circuit cannot correctly detect the valley point of the resonance, thus, the delayed time cannot be accurately quantized. In order to realize the delay, the first control module Control_1 controls the reversible counter to enter the state of forward counting from the waiting state and count 1 bit forward, then immediately stops counting to get the final count result $T_N$ of the reversible counter in the Nth switching cycle. Although it is hard to accurately quantify the delayed time, it can finally achieve to turn on the power tube at the valley point by adjusting the delayed time in a plurality of switching cycles.

d). Using the register to store the final count result $T_N$ of the reversible counter obtained in step c), then resetting the reversible counter, and assigning the final count result $T_N$ of the reversible counter stored in the register to the backward counter to be the initial value of the backward counter starting counting in step a) in the (N+1)th switching cycle. In the N+1th switching cycle, the backward counter uses $T_N$ to adjust the time when the enable signal C is turned high, so that the power tube can be turned on at the valley point.

In the first switching cycle, after the oscillator generates a 100 MHz square wave signal by turning high the resonance generation signal Resonance, the first control module Control_1 controls the reversible counter to start counting, while the second control module Control_2 does not output CLK_2, and the backward counter does not count. When the valley signal Valley turns high, turning high the enable signal C, meanwhile, stopping the reversible counter and storing the final count result $T_1$ of the reversible counter in the first switching cycle as the initial value of the backward counter in the second switching cycle.

In summary, in this embodiment, according to the difference between the turn-on time of the power tube and the valley point of the resonance in the Nth switching period, the reversible counter digitally quantizes the theoretical generation time of the enable signal C. The result is stored in the register and assigned to the backward counter in the N+1th cycle, and the backward counter generates the enable signal C of the N+1th cycle, so that the power tube is turned on at the valley point of the resonance. In this embodiment, the resonance period and the driving delayed time are quantized by a reversible measurement method, which achieves the coincidence of the valley point of the resonance and the turn-on time of the power tube at the same time, adaptively realizing zero voltage switching, improving system efficiency, and getting rid of the disadvantages of low efficiency and narrow application range of the conventional scheme.

Figure 3:
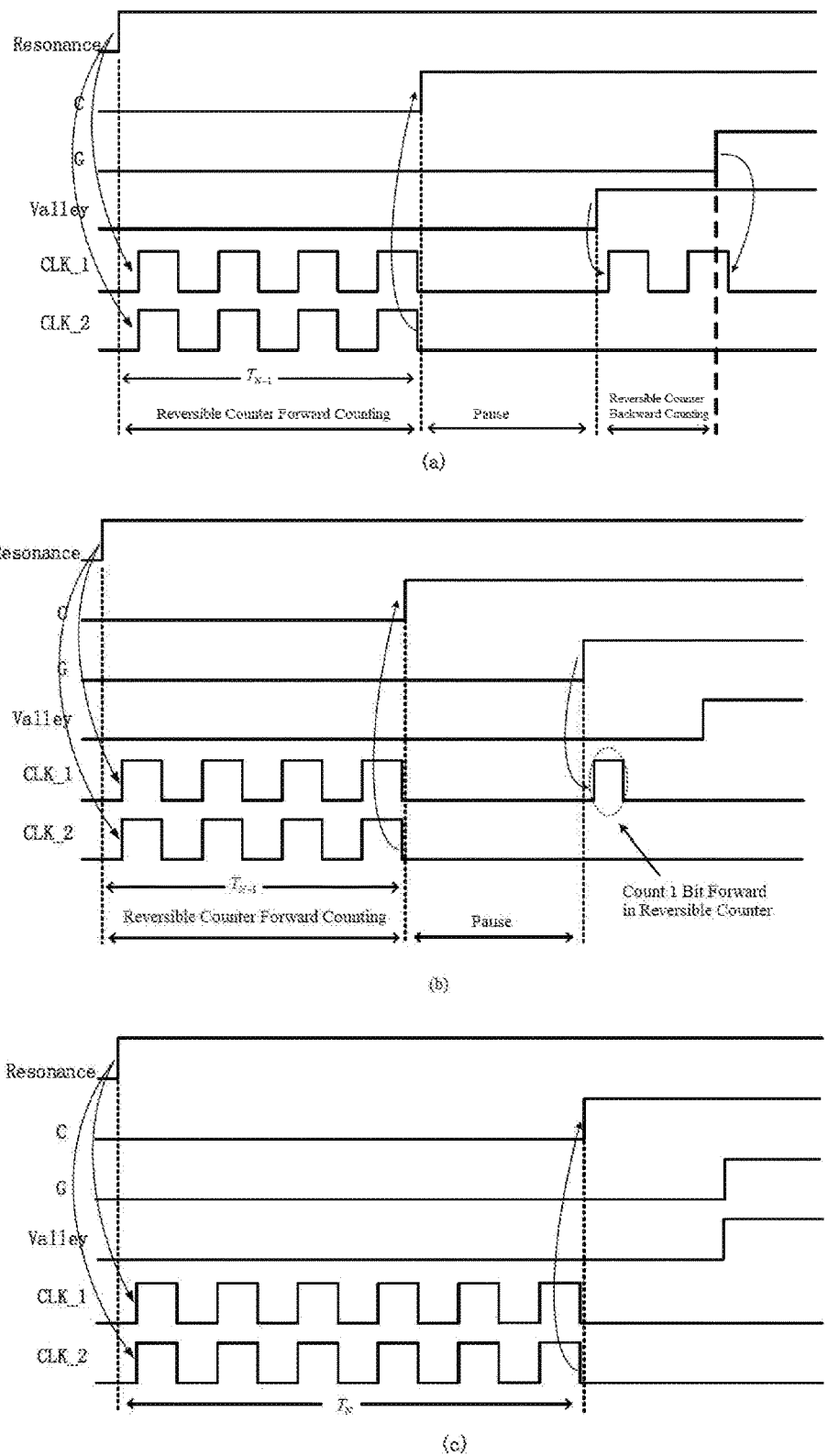
FIG. 3 is a working time sequence diagram of the adaptive control method for zero voltage switching provided by the embodiment of the present invention.

FIG. 3 is a working time sequence diagram of the control process of the embodiment, where FIG. 3(a) shows the situation that the turning high of the valley signal Valley is prioritized over the output signal G of the gate driving circuit in the Nth switching cycle; when the resonance generation signal Resonance is turned high, the first control module Control_1 and the second control module Control_2 output the 100 MHz square wave signals CLK_1 and CLK_2 generated by the oscillator as clock signals of the reversible counter and the backward counter; after counting the final count result $T_{N-1}$ of the reversible counter obtained by the N-1th switching cycle, the first control module Control_1 is paused to output CLK_1, and the second control module Control_2 no longer outputs CLK_2. When it is detected that the valley signal Valley turns high, the first control module Control_1 continues to output CLK_1 until the output signal G of the gate driving circuit is detected to stop turning high, and the reversible counter stops counting to obtain the final count result $T_N$. FIG. 3(b) shows the situation that the turning high of the output signal G of the gate driving circuit is prioritized over that of the valley signal Valley in the Nth switching cycle. The differences between FIG. 3(a) and FIG. 3(b) is that FIG. 3 (b) first detects the high level output signal G of the gate driving circuit, and the first control module Control_1 outputs one clock cycle of CLK_1, so that the reversible counter only counts one bit in the forward direction. FIG. 3(c) shows a waveform diagram in which the power tube is turned on at the valley point in the (N+1)th switching cycle in an ideal state after adjusting N switching cycles.

The present invention can turn on the power tube when the drain voltage of the power tube reaches the minimum, thus reducing the switching loss and adaptively adjusting without being affected by application conditions. It is worth mentioning that, based on the present invention, it is also possible to adjust any two signals to achieve the changes at the same time without being limited to turn-on of the power tube for adjusting the switching voltage of the present invention. Those skilled in the art can make various other specific modifications and combinations without departing from the spirit and scope of the present invention, and these modifications and combinations are still within the scope of the present invention. The present invention can adaptively turn on the switch transistor when the drain voltage of the switch transistor reaches a minimum, thereby realizing zero voltage switching, reducing the power consumption of the switching power supply, and widen the application range.

What is claimed is:

1. An adaptive control method for zero voltage switching, wherein the adaptive control method turns on a power tube at a lowest drain voltage by adjusting a turn-on time of the power tube in a switching power supply in each switching cycle, and the power tube is controlled to be turned on or off by a gate driving circuit;

in an Nth switching cycle, N is a positive integer greater than 1, the adaptive control method for adjusting the turn-on time of the power tube in the switching power supply comprises the following steps:

step 1, turning off the power tube, then controlling a reversible counter and a backward counter to start counting by using a clock signal; making the reversible counter to start counting from zero and the backward counter to start counting down from a value that is a final result generated by the reversible counter in an N−1th switching cycle;

step 2, when the backward counter counts to zero, making the backward counter stop counting and the reversible counter pause counting, and enabling the gate driving circuit;

step 3, detecting whether a drain voltage of the power tube reaches a minimum value and whether an output voltage of the gate driving circuit is inverted; when it is detected that the drain voltage of the power tube has reached the minimum value, controlling the reversible counter to count down until the output voltage of the gate driving circuit is detected to be inverted; on detecting that the output voltage of the gate driving circuit is inverted, making the reversible counter increment by one bit and then stop counting;

step 4, storing a final counting result of the reversible counter obtained in step 3 and using the final counting result as an initial value of the backward counter described in step 1 in an N+1th switching cycle, and then resetting the reversible counter;

during the first switching cycle, using the clock signal to control the reversible counter to increment from zero after the power tube is turned off, then detecting whether the drain voltage of the power tube reaches the minimum value; on detecting that the drain voltage of the power tube reaches the minimum value, enabling the gate driving circuit, making the reversible counter stop counting, and using a final counting result of the reversible counter in the first switching cycle as an initial value of the backward counter in the second switching cycle.

2. The adaptive control method for zero voltage switching of claim 1, wherein once a resonance occurs at a drain terminal of the power tube, in step 1, after turning off the power tube, firstly detecting whether the resonance occurs at the drain terminal of the power tube; on detecting that the resonance occurs, using an oscillator to generate the clock signal to control the reversible counter and the backward counter to start counting.

* * * * *

UNITED STATES PATENT AND TRADEMARK OFFICE
CERTIFICATE OF CORRECTION

PATENT NO. : 10,374,506 B1  
APPLICATION NO. : 16/174307  
DATED : August 6, 2019  
INVENTOR(S) : Ze-kun Zhou et al.

Page 1 of 1

It is certified that error appears in the above-identified patent and that said Letters Patent is hereby corrected as shown below:

On the Title Page

Item (73) Assignee should read:  
University of Electronic Science and Technology of China, Chengdu (CN)

Signed and Sealed this  
First Day of October, 2019

Andrei Iancu  
*Director of the United States Patent and Trademark Office*